United States Patent
Ziger

(10) Patent No.: US 6,327,513 B1
(45) Date of Patent: Dec. 4, 2001

(54) METHODS AND APPARATUS FOR CALCULATING ALIGNMENT OF LAYERS DURING SEMICONDUCTOR PROCESSING

(75) Inventor: David Ziger, San Antonio, TX (US)

(73) Assignee: VLSI Technology, Inc., Sunnyvale, CA (US)

(*) Notice: Subject to any disclaimer, the term of this patent is extended or adjusted under 35 U.S.C. 154(b) by 0 days.

(21) Appl. No.: 09/061,746

(22) Filed: Apr. 16, 1998

(51) Int. Cl.$^7$ .................................................. G06F 19/00
(52) U.S. Cl. .............................. 700/121; 437/225; 438/18
(58) Field of Search ........................... 700/121; 437/225; 438/18

(56) References Cited

U.S. PATENT DOCUMENTS

| | | | |
|---|---|---|---|
| 3,796,497 | * | 3/1974 | Mathisen et al. .................. 356/152 |
| 4,052,603 | * | 10/1977 | Karlson .................................. 364/140 |
| 4,470,875 | * | 9/1984 | Poteat .................................... 156/644 |
| 4,610,940 | | 9/1986 | Araihara .................................... 430/5 |
| 4,712,016 | * | 12/1987 | Matsumura ........................... 250/548 |
| 4,742,233 | | 5/1988 | Kuyel ...................................... 250/491 |
| 4,944,836 | * | 7/1990 | Beyer et al. ........................... 156/645 |
| 5,017,514 | | 5/1991 | Nishimoto ............................. 437/229 |
| 5,260,599 | * | 11/1993 | Ponse et al. ........................... 257/620 |
| 5,271,798 | | 12/1993 | Sandhu .................................. 156/638 |
| 5,316,966 | * | 5/1994 | Van Der Plas et al. ............... 437/70 |
| 5,316,984 | * | 5/1994 | Leourx .................................. 437/250 |
| 5,545,570 | * | 8/1996 | Chung et al. ............................ 437/8 |
| 5,545,593 | * | 8/1996 | Watkins et al. ...................... 437/225 |
| 5,614,446 | * | 3/1997 | Ramaswami et al. ................ 437/228 |
| 5,614,767 | | 3/1997 | Ohara .................................... 257/797 |
| 5,633,505 | | 5/1997 | Chung ................................ 250/491.1 |
| 5,637,186 | | 6/1997 | Liu .......................................... 438/14 |
| 5,668,042 | * | 9/1997 | Bae ......................................... 438/18 |
| 5,712,063 | | 1/1998 | Ahn .......................................... 430/5 |

OTHER PUBLICATIONS

Merriam Webster's Collegiate Dictionary—10$^{th}$ Edition, Principal Copyright 1993, 1 page (p. 842).

* cited by examiner

Primary Examiner—Ayaz Sheikh
Assistant Examiner—Frantz B. Jean
(74) Attorney, Agent, or Firm—Wells, St. John, Roberts, Gregory & Matkin PS

(57) ABSTRACT

Methods and apparatus for calculating alignment of layers during semiconductor processing are described. In one embodiment, first and second alignment targets are formed over a substrate and include respective pairs of first and second alignment target edges. The second alignment target defines a point of reference. First and second distances are measured between the first alignment target edges and the second alignment target edges as respective first and second functions of the distance from the point of reference. The first and second functions are differenced to define a linear equation having a slope and an intercept which contains offset components in two different directions. In a preferred embodiment, third and fourth alignment targets are formed over the substrate, with the fourth alignment target defining a different point of reference. The third and fourth alignment targets include respective edges, and third and fourth distances are measured between different respective edges of the third and fourth alignment targets as respective functions of the distances from the different point of reference. The third and fourth functions are differenced to define a linear equation having a slope and a second intercept which contains offset components in the same two different directions as the first-mentioned intercept. Values are calculated for the offsets using the first and second intercepts.

23 Claims, 8 Drawing Sheets

METHODS AND APPARATUS FOR CALCULATING ALIGNMENT OF LAYERS DURING SEMICONDUCTOR PROCESSING

TECHNICAL FIELD

This invention relates to methods and apparatus for calculating alignment of layers during semiconductor processing.

BACKGROUND OF THE INVENTION

Semiconductor devices are typically fabricated by forming a number of layers of material over a wafer and etching such layers to form integrated circuitry features such as conductive lines, resistors, capacitors, interconnect lines, contact openings, and the like. Alignment of overlying layers to underlying layers can be critical, especially as device dimensions continue to shrink.

One approach which has been taken in the past to check wafer alignment during fabrication has been through the use of vernier pattern technology. This technology typically uses patterns comprising a plurality of alignment marks which are formed over one another at different wafer elevations and at different pitches. Misalignments are determined by perceived changes in the overlapping relationship of the patterns from a known overlapping relationship, and quantified by observing the extent to which the patterns' pitch variations cause the patterns to be misaligned. Additional information on alignment technologies can be found in the following references, the disclosures of which are incorporated herein: U.S. Pat. Nos. 4,610,940, 4,742,233, 5,017,514, 5,271,798, 5,545,593, 5,614,446, 5,614,767, 5,633,505, 5,637,186, 5,668,042, and 5,712,063.

This invention arose out of concerns associated with improving the methods and apparatus which are utilized to calculate alignment of layers during semiconductor processing.

SUMMARY OF THE INVENTION

Methods and apparatus for calculating alignment of layers in an integrated circuitry device are described. In one embodiment, a first alignment target is formed over a substrate and includes a pair of first If alignment target edges. A second alignment target is formed over the first alignment target and includes a pair of second alignment target edges. The second alignment target define a point of reference. A first distance is measured between one of the first alignment target edges and one of the second alignment target edges as a first function of the distance from the point of reference. A second distance is measured between the other of the first alignment target edges and the other of the second alignment target edges as a second function of the distance from the point of reference. The first and second functions are differenced to define a linear equation having a slope and an intercept. The intercept contains offset components in two different directions. In a preferred embodiment, a third alignment target is formed over the substrate and a fourth alignment target is formed over the third alignment target and defines a different point of reference. The alignment targets include respective edges, and third and fourth distances are measured between different respective edges of the third and fourth alignment targets as respective functions of the distances from the different point of reference. The third and fourth functions are differenced to define a linear equation having a slope and a second intercept. The second intercept contains offset components in the same two different directions as the first-mentioned intercept. Values are then calculated for the offsets using the first and second intercepts.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
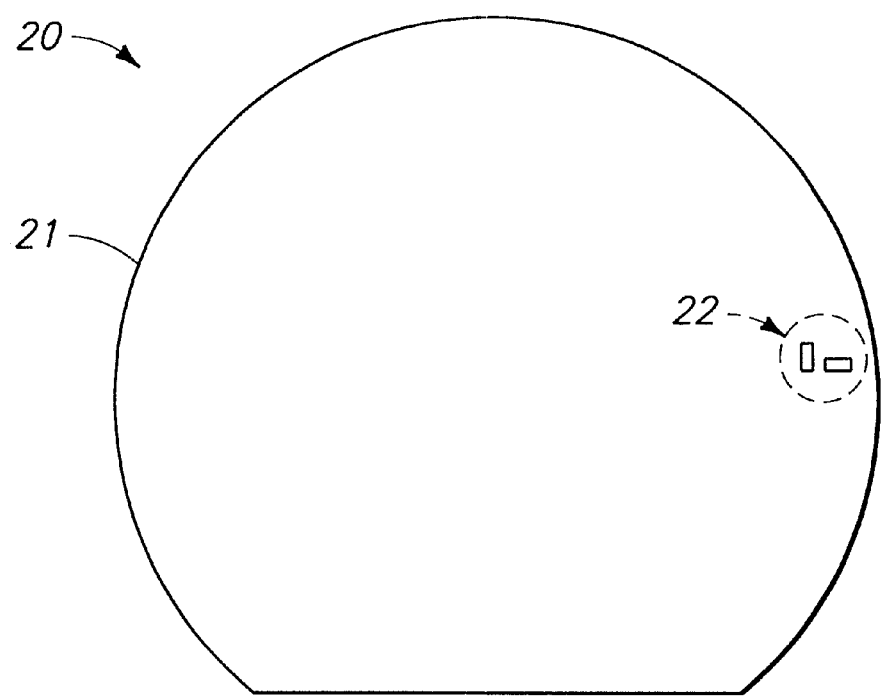
FIG. 1 is a top plan view of a semiconductor wafer undergoing alignment processing in accordance with one embodiment of the present invention.

Referring to FIG. 1, a semiconductor wafer is shown generally at 20 and includes a semiconductive substrate 21. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. An alignment area 22 is provided within which alignment processing is conducted. Typically, during alignment processing, an overlying layer of material, e.g. photoresist, is aligned to an underlying layer of material. The photoresist typically defines a pattern which is to be etched into a layer of material which is formed over the substrate.

Figure 2:
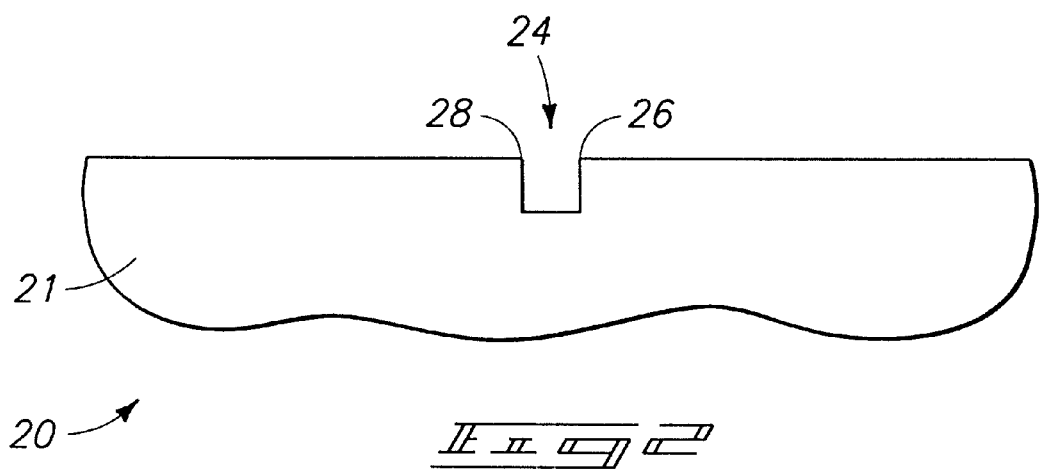
FIG. 2 is a diagrammatic side sectional view of the FIG. 1 wafer fragment, and shows a portion of a first alignment target which is As formed over the substrate.
Figure 3:
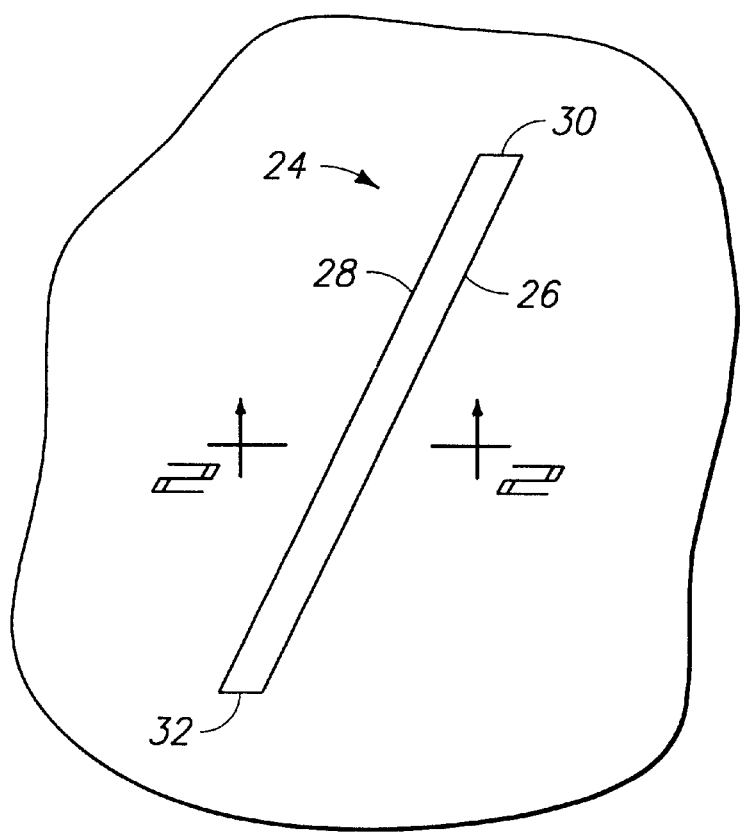
FIG. 3 is a top plan view of the FIG. 2 wafer fragment.

Referring to FIGS. 2 and 3, a first alignment target 24 is formed over substrate 21 and includes first and second alignment pattern lines 26, 28 which are spaced-apart from and parallel to one another. In the illustrated example, a pair of connecting lines 30, 32 extend between and join with first and second alignment pattern lines 26, 28 to form four sides or edges of a non-right angle parallelogram when viewed from above. Preferably, lines 26–32 are etched into substrate 21 and form a slot.

Figure 4:
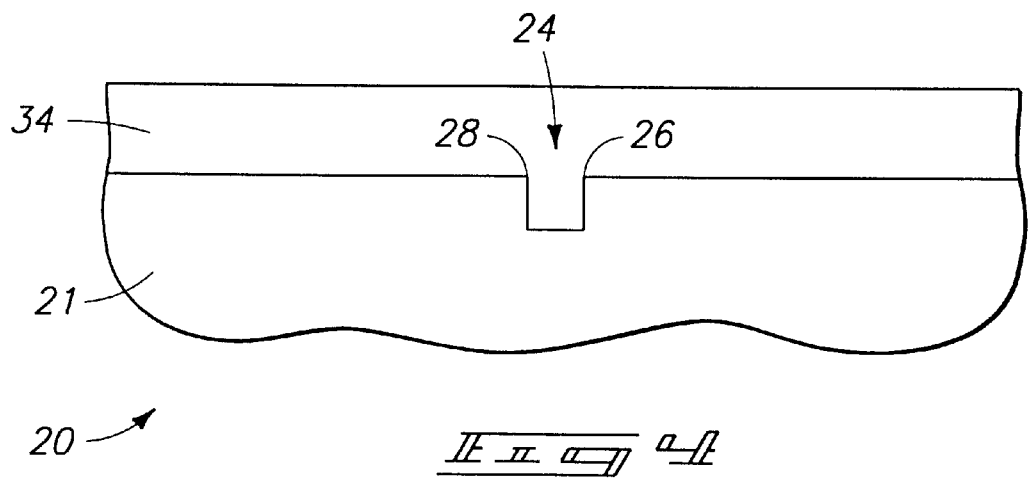
FIG. 4 is a view of the FIG. 2 wafer fragment at a different processing step.
Figure 5:
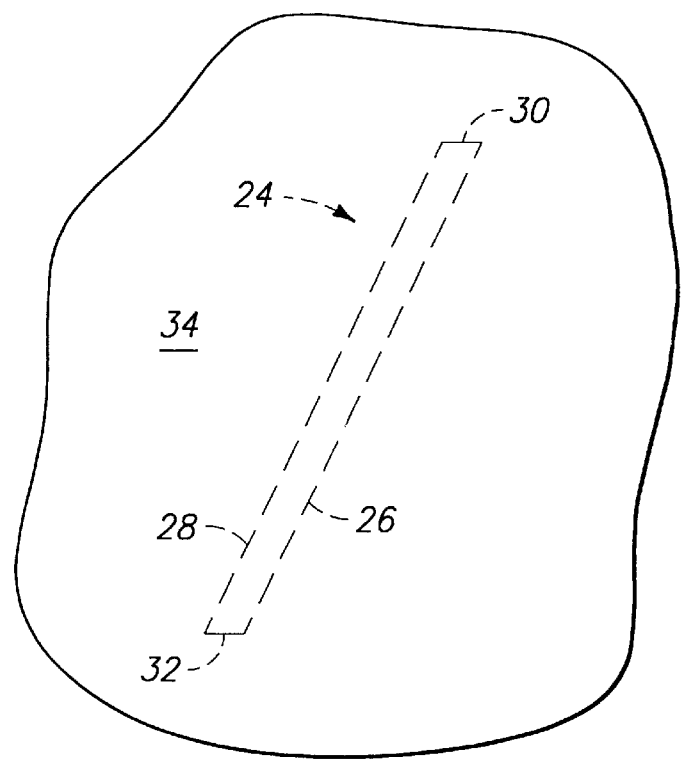
FIG. 5 is a top plan view of the FIG. 4 wafer fragment.

Referring to FIGS. 4 and 5, a material layer 34 is formed over substrate 21 and provides material through which semiconductor device components are to be etched. In the illustrated example, layer 34 comprises photoresist which can be, and preferably is suitably selectively exposed to define such semiconductor components. At a point in processing before such components are etched, but after the photoresist is exposed, it is desirable to determine whether the various layers, e.g. semiconductor component patterns, are aligned with an underlying layer.

Figure 6:
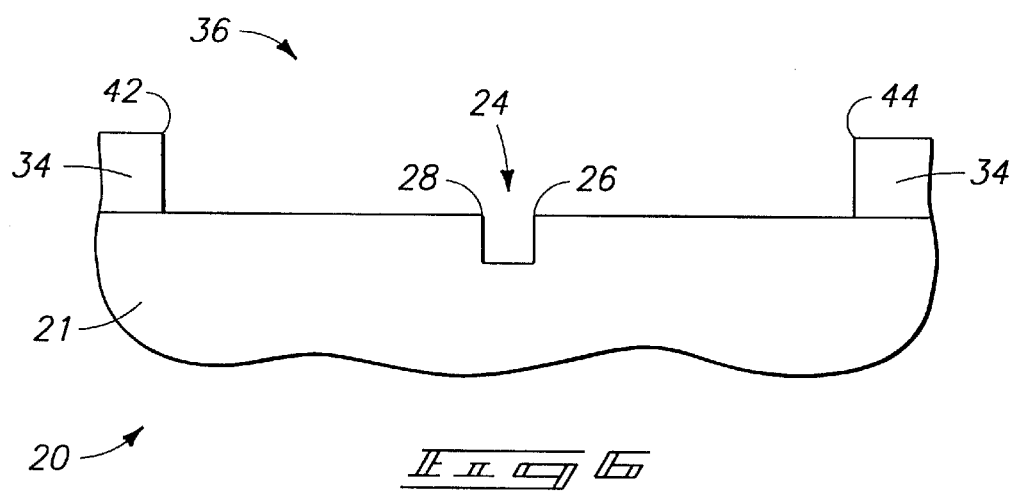
FIG. 6 is a view of the FIG. 4 wafer fragment at a different processing step, and one which is taken along line 6—6 in FIG. 7.
Figure 7:
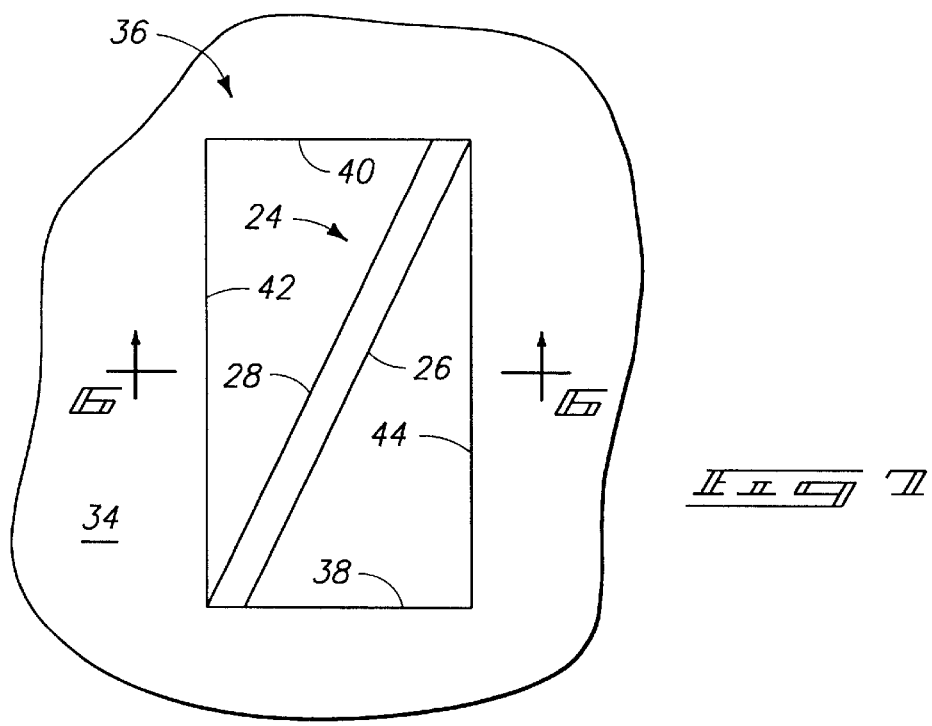
FIG. 7 is a top plan view of the FIG. 6 wafer fragment.

Referring to FIGS. 6 and 7, layer 34 is exposed and processed to form a second alignment target 36 which is superimposed over first alignment target 24. Second alignment target 36 includes a pair of second alignment target lines or edges 38, 40 which are joined by alignment target lines or edges 42, 44. In the illustrated example, alignment target edges 38–44 are arranged to define a rectangle which circumscribes a predominant portion of first and second alignment pattern lines 26, 28.

At this point in the processing, first and second alignment targets have been formed which permit misalignments and magnitudes thereof to be ascertained in accordance with the inventive methods. In a preferred embodiment, one of the alignment targets comprises a non-right angle parallelogram, while another of the alignment targets comprises a rectangle. In the illustrated example, the parallelogram is defined by first alignment target 24 which is formed elevationally below the rectangle defined by second alignment target 36. In the discussion which immediately follows, methods and apparatus are described which permit the leveraging of misalignments in one direction by measuring offsets in the centering of a high-aspect ratio parallelogram, e.g. alignment target 24. Such will become more apparent below.

Figure 8:
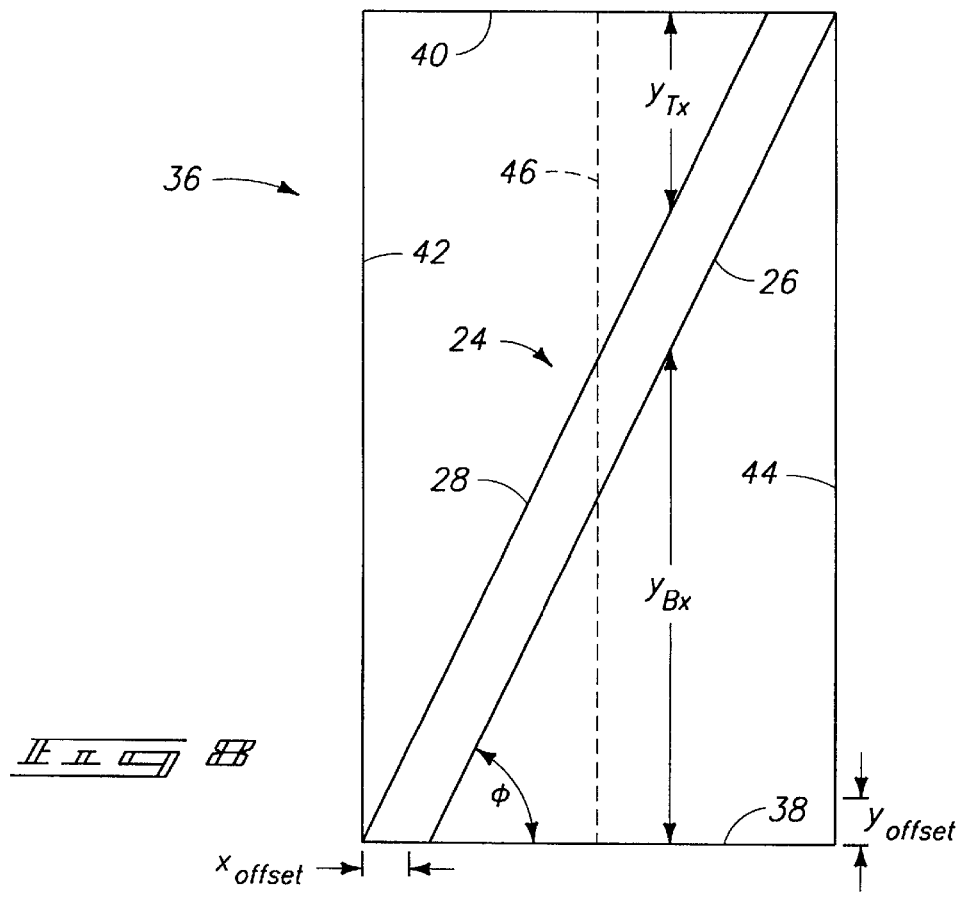
FIGS. 8 and 9 are schematic representations of first and second alignment targets in accordance with one embodiment of the present invention. For clarity, the representations are shown isolated and away from the wafer over which each is formed.

Referring to FIG. 8, and for purposes of clarity, alignment targets 24, 36 have been isolated away from substrate 21 to illustrate one embodiment of the invention which can be utilized to calculate the alignment or misalignment of layers. A point of reference 46 is defined by second alignment target 36. In the illustrated example, point of reference 46 is defined along a center line which bisects the rectangle defined by second alignment target 36. The point of reference, in this example, is considered as x=0. One can ascertain the point of reference in this example by measuring the distance between edges 42, 44 and dividing by two. An angle φ is defined between edges 26 and 38. A first distance, $y_{Bx}$, is measured between edges 26, 38, as a first function of the distance from point of reference 46 and defines a first linear equation. The first linear equation describes a first spacing relationship between edge 26 and point of reference 46. A second distance, $y_{Tx}$, is measured between edges 28, 40, as a second function of the distance from point of reference 46 and defines a second linear equation. The second linear equation describes a second spacing relationship between edge 28 and point of reference 46. The first and second functions $y_{Bx}$ and $y_{Tx}$ are then differenced, i.e. subtracted, to define an offset expression which is set forth immediately below as Equation 1:

$$y_{Bx} - y_{Tx} = 2(\tan \phi)x - 2x_{offset} \tan \phi + 2y_{offset} \quad \text{Equation 1}$$

The offset expression of Equation 1 has a slope, 2(tan φ), and an intercept, $B_{xoff}$, equal to $(-2x_{offset} \tan \phi + 2y_{offset})$. The intercept contains offset components, i.e. $x_{offset}$ and $y_{offset}$, in two different directions, which, in the illustrated and preferred example, are the x and y directions.

Figure 9:
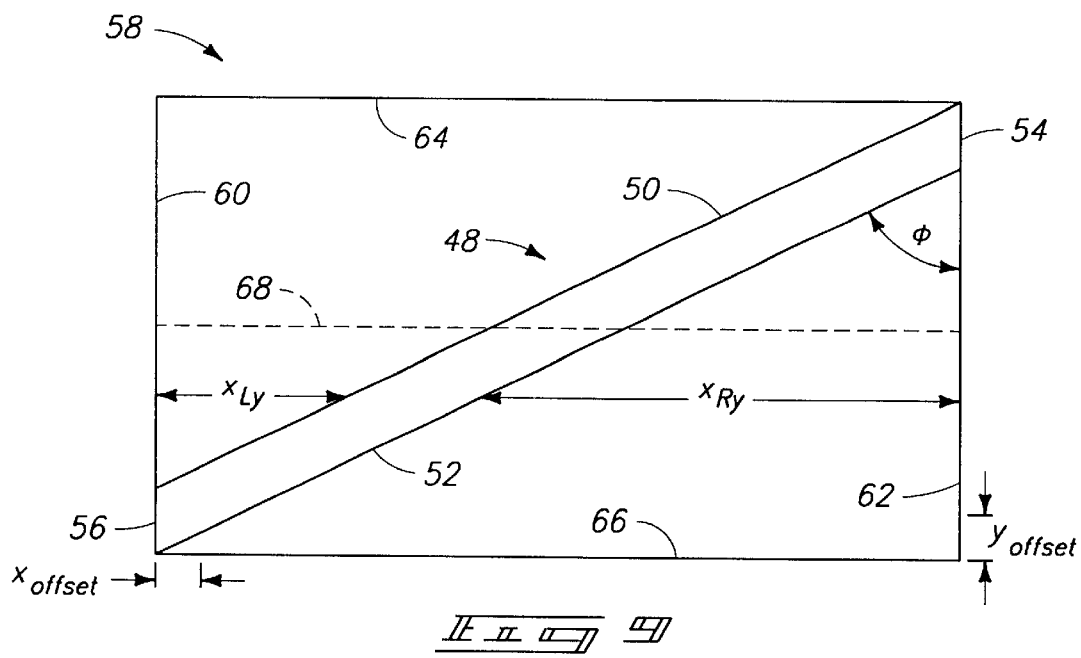

Referring to FIG. 9, third and fourth alignment targets are shown, and are preferably respectively formed when the first and second alignment target are formed. Accordingly, third alignment target 48 is preferably formed at a common substrate elevation with first alignment target 24, and fourth alignment target 58 is preferably formed at a common substrate elevation with second alignment target 36. The alignment targets at common elevations are preferably similar in construction. Accordingly, third alignment target 48 includes first and second alignment pattern lines or edges 50, 52, which are joined by connecting lines or edges 54, 56. The lines or edges are arranged to define a non-right angle parallelogram. Fourth alignment target 58 is formed superimposed over third alignment target 48, and is preferably similar in construction to second alignment target 36. Accordingly, fourth alignment target 58 includes alignment target edges 60, 62 which are joined by respective alignment target edges 64, 66. In the illustrated example, alignment target edges 60–66 are arranged to define a rectangle which circumscribes a predominant portion of first and second alignment pattern lines 50, 52. A different point of reference 68 is defined in much the same way as was point of reference 46 (FIG. 8). Point of reference 68 is considered as y=0. An angle φ is defined between edges 52, 62.

A third distance $x_{Ly}$ is measured between edges 50, 60 as a third function of the distance from point of reference 68 and defines a third linear equation. The third linear equation describes a third spacing relationship between third alignment pattern line 50 and point of reference 68. A fourth distance, $x_{Ry}$, is measured between edges 52 and 62 as a function of the distance from point of reference 68. Such defines a fourth linear equation describing a fourth spacing relationship between fourth alignment pattern line 52 and point of reference 68. The third and fourth functions or linear equations are differenced, i.e. subtracted, to define an offset expression which is set forth as Equation 2 immediately below:

$$x_{Ly} - x_{Ry} = 2(\tan \phi)y - 2y_{offset} \tan \phi + 2x_{offset} \quad \text{Equation 2}$$

Equation 2 has a second slope, 2(tan φ), and a second intercept, $B_{yoff}$, which is equal to $(-2y_{offset} \tan \phi + 2x_{offset})$. Second intercept $B_{yoff}$ contains offset components in two directions which, in the preferred embodiment are the x and y directions. The first and second intercept equations are set forth immediately below:

$$B_{xoff} = -2x_{offset} \tan \phi + 2y_{offset} \quad \text{Equation 3}$$

$$B_{yoff} = -2y_{offset} \tan \phi + 2x_{offset} \quad \text{Equation 4}$$

Both $B_{xoff}$ and $B_{yoff}$ are known quantities and can be measured along the respective points of reference, i.e. at x=0 and y=0. When so measured, the slope coefficients of the offset expressions (Equations 1 and 2) are canceled out, thereby leaving the intercept equations of Equations 3 and 4, i.e. two equations and two unknowns. Such equations can now be solved for the two unknowns $x_{offset}$ and $y_{offset}$, to provide offset magnitudes in two different directions. Such constitutes but one manner of measuring $B_{xoff}$ and $B_{yoff}$. Alternately, such quantities can be measured along points of reference other than the illustrated x=0 and y=0 points of reference. In this case, a table(s) of differences versus respective x and y values can be used to calculate $B_{xoff}$ and $B_{yoff}$ Expressions of the solved offset equations are set forth as Equations 5 and 6 immediately below. Such constitutes using the first and second intercepts to calculate values for the offsets in the x and y directions.

$$x_{offset} = \frac{B_{yoff} + B_{xoff}\tan\phi}{2(1-\tan^2\phi)} \quad \text{Equation 5}$$

$$y_{offset} = \frac{B_{xoff} + B_{yoff}\tan\phi}{2(1-\tan^2\phi)} \quad \text{Equation 6}$$

Figure 10:
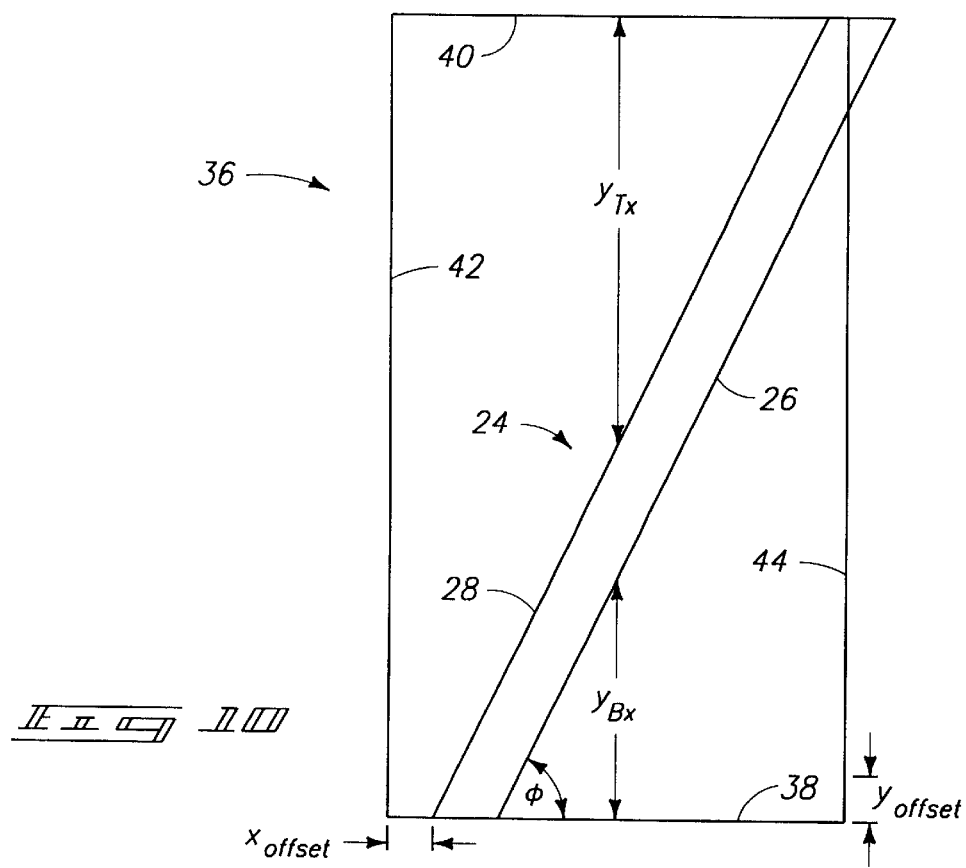
FIGS. 10 and 11 are respective views of the FIGS. 8 and 9 schematic diagrams, and represent an offset or misalignment in a first direction.
Figure 11:
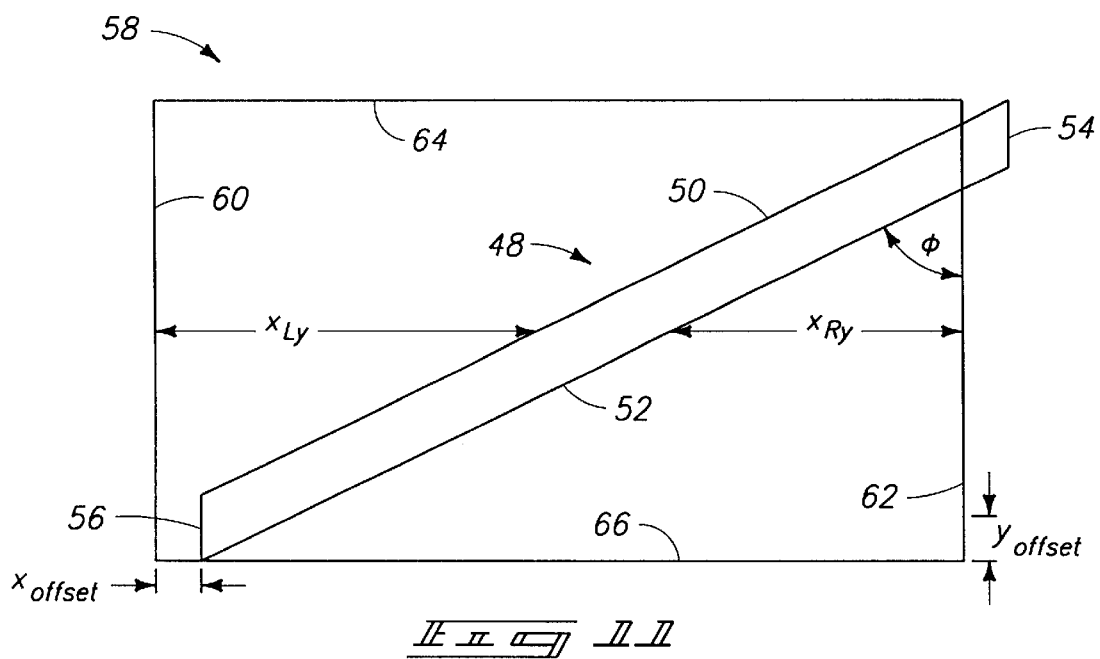

Referring to FIGS. 10 and 11, a misalignment in the x direction is shown, with no misalignment in the y direction. The misalignment in the x direction is represented by $x_{offset}$. A dimension $y_{offset}$ is shown, although there is no misalignment in the y direction. Using Equation 1 at x=0, and knowing that there is no misalignment in the y direction, the equation simplifies to:

$$y_{Bx} - y_{Tx} = -2x_{offset}\tan\phi,$$

where $y_{Bx} - y_{Tx} = B_{xoff}$

Since $B_{xoff}$ and $\tan\phi$ are known or measurable quantities, $x_{offset}$ can be calculated. Similarly, using Equation 2 at y=0, and knowing that there is no misalignment in the y direction, Equation 2 simplifies to:

$$x_{Ly} - y_{Ry} = 2x_{offset},$$

where $x_{Ly} - x_{Ry} = B_{yoff}$

In the illustrated example, the $x_{offset}$ dimension in FIG. 10 is fairly small in comparison to the measured quantities $y_{Bx}$ and $y_{Tx}$. Thus, there is an amplification of the $B_{xoff}$ term. Such amplification increases as the angle $\phi$ approaches 90 degrees. Table 1 below summarizes measurements of $B_{xoff}$ as a function of angle $\phi$ for x and y offsets of 0.001 μm and 0.01 μm.

| | | φ | | |
|---|---|---|---|---|
| offset | 0 | 70 | 80 | 85 |
| 0.001 | 0.002 | −0.00349 | −0.00934 | −0.02086 |
| 0.01 | 0.02 | −0.03495 | −0.09343 | −0.2086 |

From Table 1, $B_{xoff}$ increases by about 50% as the angle $\phi$ is increased from 0 degrees to 70 degrees. It has been observed, however, that at values of $\phi$ less than about 45°, amplification is undesirably less than about one. However, at values of $\phi$ which are greater than 45°, amplification is found to improve. At $\phi$=80 degrees, $B_{xoff}$ has increased by over a factor of four over $\phi$=0 degrees. At $\phi$=85 degrees, $B_{xoff}$ has increased by over a factor of ten over $\phi$=0 degrees. Such greatly facilitates the calculation of x and y offsets or misalignments in accordance with the inventive methods and apparatus.

Figure 12:
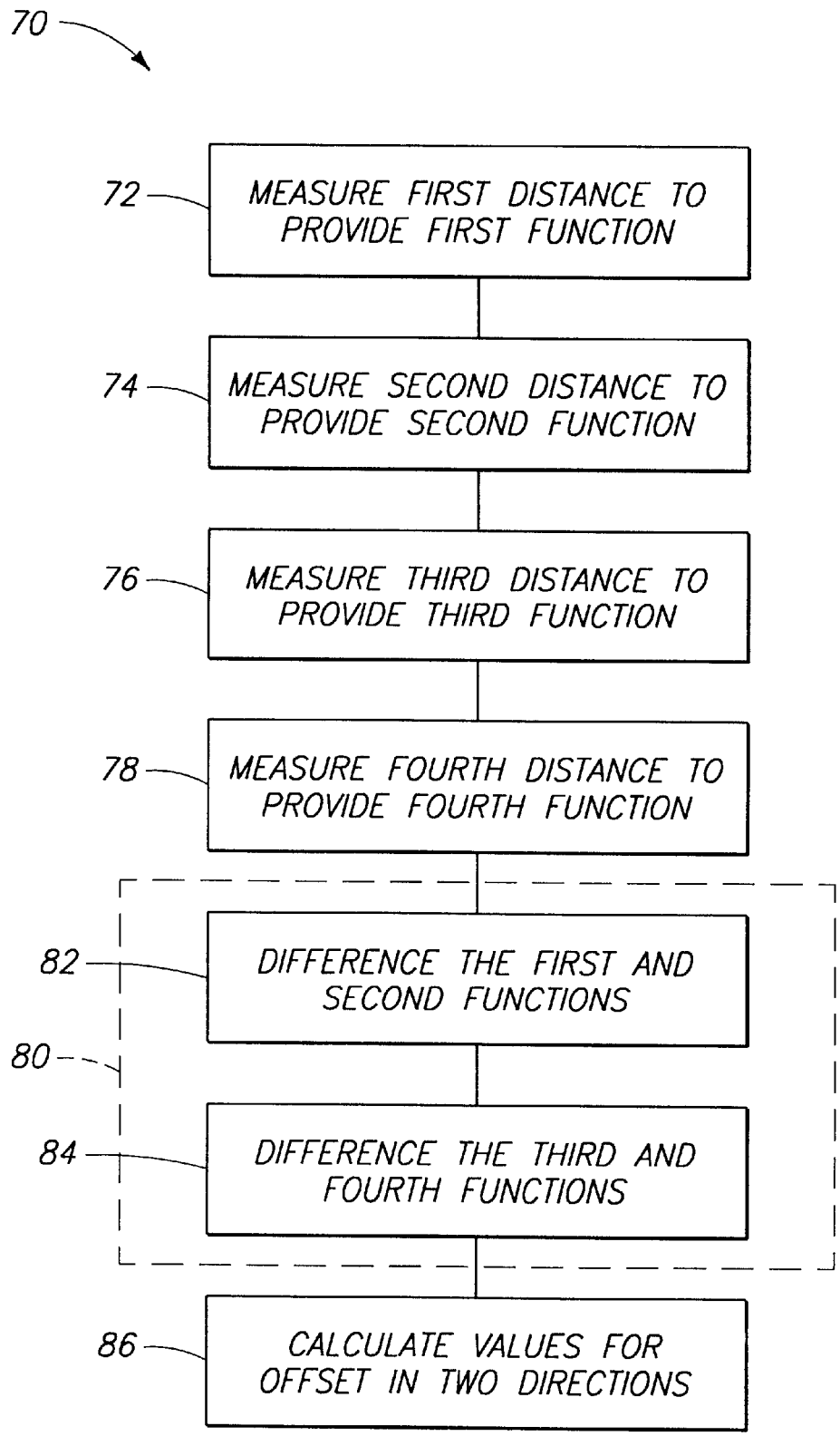
FIG. 12 is a flow diagram of methodical aspects in accordance with one embodiment of the present invention.

Referring to FIG. 12, a flow diagram is set forth generally at 70 which illustrates certain methodical aspects of the present invention. The method can be implemented using suitably formed first and second alignment patterns, with but one example of such patterns being given above. At 72, a first distance is measured to provide a first function which defines a first linear equation. At 74, a second distance is measured to provide a second function which defines a second linear equation. At 76, a third distance is measured to provide a third function which defines a third linear equation. At 78, a fourth distance is measured to provide a fourth function which defines a fourth linear equation. At 80, offset expressions are calculated by combining the functions. In the illustrated example, the first and second functions are differenced at 82 and the third and fourth functions are differenced at 84. In this example, such provides, respectively, Equations 1 and 2 above. From Equations 1 and 2, values for offset in two directions, e.g. the x and y directions, can be calculated.

Figure 13:
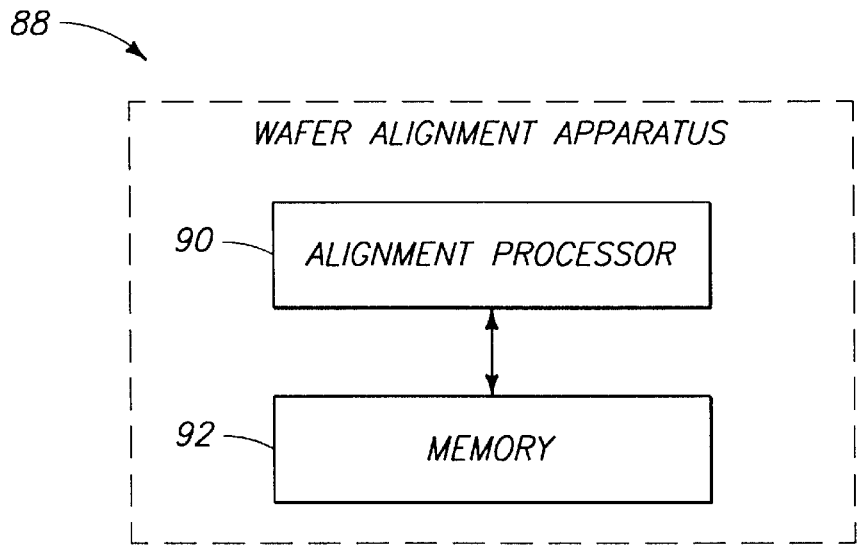
FIG. 13 is a high-level diagram of a wafer alignment apparatus in accordance with one embodiment of the present invention.
Figure 14:
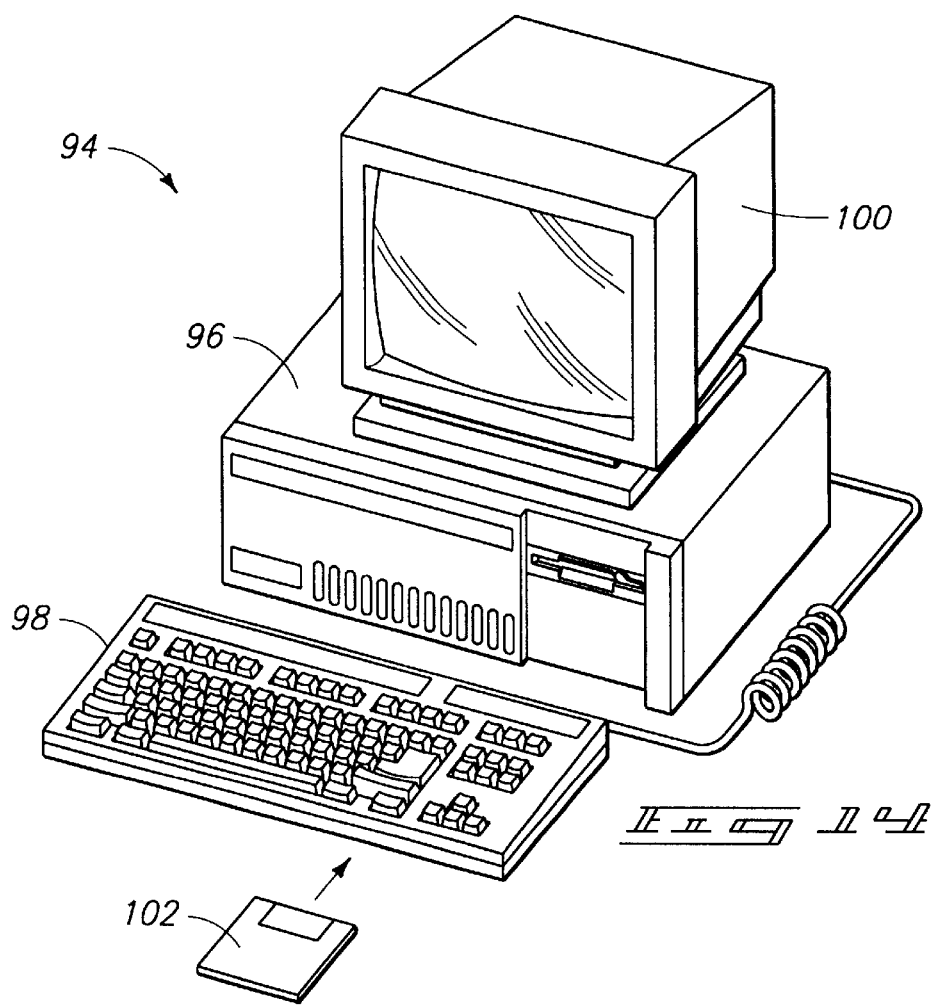
FIG. 14 is a diagram of a computer system that may be used to implement methods and apparatus embodying the present invention.

Referring to FIG. 13, and in accordance with one embodiment of the invention, a wafer alignment apparatus 88 is shown and includes an alignment processor 90 and a memory 92. Wafer alignment apparatus 88 and/or alignment processor 90 can be implemented in any suitable hardware, software, or firmware which can be configured to implement the various methodologies of the invention, including deriving and processing the equations described above. In but one aspect, apparatus 88 can comprise a programmable computer such as the one shown generally at 94 in FIG. 14, which can be used or programmed to implement the various methods of the invention. Computer 94 can include a hard drive 96, an input device 98, and an output device 100.

Hard drive 96 generally includes a central processing unit (CPU) and a memory system that communicate through a bus structure. The CPU includes an arithmetic logic unit (ALU) for performing computations, various registers for temporary storage of data and instructions, and a control unit for controlling the operation of the computer in response to instructions from a computer program such as an application or an operating system.

The memory system generally includes a high-speed main memory in the form of a medium such as random access memory (RAM) and read only memory (ROM) semiconductor devices and secondary storage in the form of a medium such as floppy discs 102, hard discs tape, CD-ROM, etc. and other devices that use optical or magnetic recording material. The memory system stores programs such as a computer's operating system and currently running application programs, e.g. such as those which implement one or more of the inventive methods described above. The main memory also includes video display memory for displaying images through a display output device such as monitor 100.

Input device 98 and output device 100 are typically peripheral devices connected by bus structure to the computer. Input device may be a keyboard as indicated, but may also be a modem, pointing device, pen, or other device for providing input data to the computer. The input device can also include various optical scanning devices which are capable of examining the alignment patterns and measuring the desired parameters described above. An exemplary device is a so-called stepper. Output device 100 may be a monitor as indicated, but may also be a printer, modem, sound device or other device for providing output data from the computer. The input and output devices may be combined into a single device if desired.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of calculating alignment of layers during semiconductor processing comprising:

forming a first alignment target over a substrate, the first alignment target having a pair of first alignment target edges;

forming a second alignment target over the first alignment target, the second alignment target having a pair of second alignment target edges, the second alignment target defining a point of reference;

measuring a first distance between one of the first alignment target edges and one of the second alignment target edges as a first function of the distance from the point of reference; and measuring a second distance between the other of the first alignment target edges and the other of the second alignment target edges as a second function of the distance from the point of reference;

forming a third alignment target over the substrate, the third alignment target having a pair of third alignment target edges;

forming a fourth alignment target over the third alignment target, the fourth alignment target having a pair of fourth alignment target edges, the fourth alignment target defining a different point of reference;

measuring a third distance between one of the third alignment target edges and one of the fourth alignment target edges as a third function of the distance from the different point of reference;

measuring a fourth distance between the other of the third alignment target edges and the other of the fourth alignment target edges as a function of the distance from the different point of reference;

differencing the first and second functions to define a linear equation having a slope and a first intercept, the first intercept containing offset components in the x and y directions;

differencing the third and fourth functions to define a linear equation having a slope and a second intercept, the second intercept containing offset components in the x and y directions; and using the first and second intercepts, calculating values for the offset in the x and y directions, wherein:

the forming of the first and third alignment targets comprises forming individual non-right angle parallelograms at a common substrate elevation; and the forming of the second and fourth alignment targets comprises forming individual rectangles at common substrate elevations.

2. The method of claim 1, wherein the forming of the second alignment target comprises forming a rectangle, and the point of reference is defined along a center line which bisects the rectangle.

3. A method of calculating alignment of layers during semiconductor processing comprising:

forming a first alignment target over a substrate;

forming a second alignment target over the first alignment target, one of the first and second alignment targets defining a generally non-right angle parallelogram, the other of the alignment targets generally defining a rectangle, one of the first and second alignment targets defining a point of reference;

measuring a first distance between one of the sides of the parallelogram and one of the sides of the rectangle as a first function of the distance of said parallelogram side from the point of reference;

measuring a second distance between a different one of the sides of the parallelogram and a different one of the sides of the rectangle as a second function of the distance of said different parallelogram side from said point of reference; and calculating an offset expression from said first and second functions, said offset expression containing offset components in two different directions;

forming a third alignment target over the substrate;

forming a fourth alignment target over the third alignment target, one of the third and fourth alignment targets defining a second generally non-right angle parallelogram, the other of the third and fourth alignment targets generally defining a second rectangle, one of the third and fourth alignment targets defining a different point of reference;

measuring a third distance between one of the sides of the second parallelogram and one of the sides of the second rectangle as a third function of the distance of said second parallelogram side from the different point of reference;

measuring a fourth distance between a different one of the sides of the second parallelogram and a different one of the sides of the second rectangle as a fourth function of the distance of said different second parallelogram side from said different point of reference; and calculating a second offset expression from said third and fourth functions, said second offset expression containing individual offset components in said two different directions, wherein said calculating of said offset expression and said second offset expression comprises respectively:

differencing said first and second functions; and differencing said third and fourth functions, wherein said differencing steps define individual linear equations having individual respective slopes and intercepts, each of said slopes and intercepts being a function of an angle $\phi$ defined between the respective sides of the parallelogram and rectangle from which either of the first and second functions, or the third and fourth functions, were respectively derived.

4. The method of claim 3 further comprising using said intercepts to calculate values for offset in said two different directions.

5. A method of calculating alignment of layers during semiconductor processing comprising:

deriving a first linear equation describing a spacing relationship between a first alignment pattern line and a point of reference, the first linear equation having a slope and an intercept;

deriving a second linear equation describing a second spacing relationship between a second alignment pattern line and the point of reference, the second linear equation having a slope and an intercept;

deriving a third linear equation describing a third spacing relationship between a third alignment pattern line and a different point of reference, the third linear equation having a slope and an intercept;

deriving a fourth linear equation describing a fourth spacing relationship between a fourth alignment pattern line and said different point of reference, the fourth linear equation having a slope and an intercept;

differencing the first and second linear equations and calculating a first intercept equation;

differencing the third and fourth linear equations and calculating a second intercept equation; and solving the first and second intercept equations for offset magnitudes in two different directions to determine a degree of misalignment if present.

6. The method of claim 5, wherein said first and second alignment pattern lines are spaced-apart from and parallel to one another.

7. The method of claim 5, wherein said third and fourth alignment pattern lines are spaced-apart from and parallel to one another.

8. The method of claim 5, wherein said point of reference is defined by a line which bisects a rectangle which is superimposed over the first and second alignment pattern lines.

9. The method of claim 8, wherein said rectangle circumscribes a predominate portion of said first and second alignment pattern lines.

10. The method of claim 8, wherein said different point of reference is defined by a different line which bisects a different rectangle which is superimposed over the third and fourth alignment pattern lines.

11. The method of claim 10, wherein said different rectangle circumscribes a predominate portion of said third and fourth alignment pattern lines.

12. A computer-implemented method of calculating alignment of layers during semiconductor processing comprising:
  measuring a first distance between one of a first alignment target edges and one of a second alignment target edges as a first function of the distance from a point of reference defined by one of the first and second alignment targets;
  measuring a second distance between another edge of the first alignment target and another edge of the second alignment target as a second function of the distance from the point of reference;
  measuring a third distance between one of a third alignment target edges and one of a fourth alignment target edges as a third function of the distance from a different point of reference defined by one of the third and fourth alignment targets;
  measuring a fourth distance between another edge of the third alignment target and another edge of the fourth alignment target as a function of the distance from the different point of reference;
  differencing the first and second functions to define a linear equation having a slope and a first intercept, the first intercept containing offset components in the x and y directions;
  differencing the third and fourth functions to define a linear equation having a slope and a second intercept, the second intercept containing offset components in the x and y directions; and
  using the first and second intercepts, calculating values for the offset in the x and y directions.

13. A computer-readable medium on which is stored a computer program comprising instructions which when executed by a computer perform the method of claim 12.

14. A computer-implemented method of calculating alignment of layers during semiconductor processing comprising:
  measuring a first distance between a side of a parallelogram and a side of a rectangle as a first function of a distance of said parallelogram side from a point of reference, one of the parallelogram and the rectangle being formed over the other, one of the parallelogram and the rectangle defining the point of reference;
  measuring a second distance between a different side of the parallelogram and a different side of the rectangle as a second function of the distance of said different parallelogram side from said point of reference;
  calculating an offset expression from said first and second functions, said offset expression containing offset components in two different directions;
  measuring a third distance between one side of a second parallelogram and one side of a second rectangle as a third function of the distance of said second parallelogram side from a different point of reference, one of the second parallelogram and the second rectangle being formed over the other, one of the second parallelogram and the second rectangle defining the different point of reference;
  measuring a fourth distance between a different side of the second parallelogram and a different side of the second rectangle as a fourth function of the distance of said different second parallelogram side from said different point of reference; and
  calculating a second offset expression from said third and fourth functions, said second offset expression containing individual offset components in said two different directions.

15. The computer-implemented method of claim 14 further comprising determining from said offset expression and said second offset expression, values for offset in said different directions.

16. The computer-implemented method of claim 14 wherein said different directions comprise x and y directions.

17. The computer-implemented method of claim 14, wherein said calculating of said offset expression and said second offset expression comprises respectively:
  differencing said first and second functions; and
  differencing said third and fourth functions.

18. A computer-readable medium on which is stored a computer program comprising instructions which when executed by a computer perform the method of claim 14.

19. A programmable computer for calculating alignment of layers during semiconductor processing, the computer comprising:
  means for measuring a first distance between one of a first alignment target edges and one of a second alignment target edges as a first function of the distance from a point of reference defined by one of the first and second alignment targets;
  means for measuring a second distance between another edge of the first alignment target and another edge of the second alignment target as a second function of the distance from the point of reference;
  means for measuring a third distance between one of a third alignment target edges and one of a fourth alignment target edges as a third function of the distance from a different point of reference defined by one of the third and fourth alignment targets;
  means for measuring a fourth distance between another edge of the third alignment target and another edge of the fourth alignment target as a function of the distance from the different point of reference;
  means for differencing the first and second functions to define a linear equation having a slope and a first intercept, the first intercept containing offset components in the x and y directions;
  means for differencing the third and fourth functions to define a linear equation having a slope and a second intercept, the second intercept containing offset components in the x and y directions; and means for using the first and second intercepts to calculate values for the offset in the x and y directions.

20. A programmable computer for calculating alignment of layers during semiconductor processing, the computer comprising:

means for measuring a first distance between a side of a parallelogram and a side of a rectangle as a first function of a distance of said parallelogram side from a point of reference, one of the parallelogram and the rectangle being formed over the other, one of the parallelogram and the rectangle defining the point of reference;

means for measuring a second distance between a different side of the parallelogram and a different side of the rectangle as a second function of the distance of said different parallelogram side from said point of reference;

means for calculating an offset expression from said first and second functions, said offset expression containing offset components in two different directions;

means for measuring a third distance between one side of a second parallelogram and one side of a second rectangle as a third function of the distance of said second parallelogram side from a different point of reference, one of the second parallelogram and the second rectangle being formed over the other, one of the second parallelogram and the second rectangle defining the different point of reference;

means for measuring a fourth distance between a different side of the second parallelogram and a different side of the second rectangle as a fourth function of the distance of said different second parallelogram side from said different point of reference; and means for calculating a second offset expression from said third and fourth functions, said second offset expression containing individual offset components in said two different directions.

21. The programmable computer of claim 20 further comprising means for determining from said offset expression and said second offset expression, values for offset in said different directions.

22. An article of manufacture comprising a computer usable medium having computer readable code embodied therein to cause a computer to perform the method of claim 5.

23. An article of manufacture comprising a computer usable medium having computer readable code embodied therein to cause a processor to carry out, acts of:

forming a first alignment target over a substrate, the first alignment target having a pair of first alignment target edges;

forming a second alignment target over the first alignment target, the second alignment target having a pair of second alignment target edges, the second alignment target defining a point of reference;

measuring a first distance between one of the first alignment target edges and one of the second alignment target edges as a first function of the distance from the point of reference;

measuring a second distance between the other of the first alignment target edges and the other of the second alignment target edges as a second function of the distance from the point of reference;

forming a third alignment target over the substrate, the third alignment target having a pair of third alignment target edges;

forming a fourth alignment target over the third alignment target, the fourth alignment target having a pair of fourth alignment target edges, the fourth alignment target defining a different point of reference;

measuring a third distance between one of the third alignment target edges and one of the fourth alignment target edges as a third function of the distance from the different point of reference;

measuring a fourth distance between the other of the third alignment target edges and the other of the fourth alignment target edges as a function of the distance from the different point of reference;

differencing the first and second functions to define a linear equation having a slope and a first intercept, the first intercept containing offset components in the x and y directions;

differencing the third and fourth functions to define a linear equation having a slope and a second intercept, the second intercept containing offset components in the x and y directions; and using the first and second intercepts, calculating values for the offset in the x and y directions, wherein:

the act of forming of the first and third alignment targets comprises forming individual non-right angle parallelograms at a common substrate elevation; and the act of forming of the second and fourth alignment targets comprises forming individual rectangles at common substrate elevations.

* * * * *